United States Patent [19]
Sanaka et al.

[11] Patent Number: 5,943,355
[45] Date of Patent: Aug. 24, 1999

[54] SEMICONDUCTOR LIGHT EMITTING DEVICE

[75] Inventors: Yumi Sanaka; Masao Ikeda, both of Kanagawa, Japan

[73] Assignee: Sony Corporation, Tokyo, Japan

[21] Appl. No.: 08/865,059

[22] Filed: May 29, 1997

[30] Foreign Application Priority Data

May 29, 1996 [JP] Japan ..................................... 8-157659

[51] Int. Cl.$^6$ .............................. H01S 3/19; H01L 33/00
[52] U.S. Cl. .............................. 372/45; 257/103; 257/101
[58] Field of Search ........................ 372/45, 46; 257/103, 257/101, 79, 94, 102

[56] References Cited

U.S. PATENT DOCUMENTS 5,515,393 5/1996 Okuyama et al. ........................ 372/45
5,567,960 10/1996 Ishibashi et al. ........................ 257/103

*Primary Examiner*—Rodney Bovernick
*Assistant Examiner*—Quyen Phan Leung

*Attorney, Agent, or Firm*—Hill & Simpson

[57] ABSTRACT

A semiconductor light emitting device composed of an n-type cladding layer, an n-type guide layer, an active layer, a p-type guide layer, and a p-type cladding layer which are sequentially laminated on a substrate. The p-type guide layer is formed from ZnSSe mixed crystal doped with nitrogen. That side of the p-type guide layer which is adjacent to the p-type cladding layer is a p-type semiconductor region in which the concentration of nitrogen is $2 \times 10^{17}$ cm$^{-3}$, and that side adjacent to the active layer is an intrinsic semiconductor region. The p-type cladding layer is formed from ZnMgSSe mixed crystal doped with nitrogen. That side of the p-type cladding layer which is adjacent to the p-type guide layer is the low-concentration region in which the concentration of nitrogen is $1 \times 10^{17}$ cm$^{-3}$ which is lower than the concentration at which the rate of activation begins to decrease. The opposite side is the high-concentration region in which the concentration of nitrogen os $2 \times 10^{17}$ cm$^{-3}$ which is lower than the seturated concentration.

The semiconductor light emitting device has a prolonged life owing to the adequate concentration of p-type impurity in the p-type cladding layer.

6 Claims, 3 Drawing Sheets

SEMICONDUCTOR LIGHT EMITTING DEVICE

RELATED APPLICATION

This application relates to Ser. No. 08/429,850 file Apr. 27, 1995 which is issued as U.S. Pat. No. 5,567,960.

BACKGROUND OF THE INVENTION

1. Field of the Invention

The present invention relates to a semiconductor light emitting device formed from II–VI compounds and, more particularly to a semiconductor light emitting device as a light emitting diode and semiconductor laser capable of green or blue light emission.

2. Description of the Related Art

Recently there has been a considerable interest in the II–VI compound semiconductor light emitting device as a semiconductor light emitting device capable of green or blue light emission. It is composed of an n-type cladding layer, of mixed crystal of ZnMgSSe, an n-type guide layer of ZuSe, an active layer, a p-type guide layer of ZnSe, and a p-type cladding layer of ZnMgSSe, which are formed sequentially on top of the other on a substrate by molecular beam epitaxy (MBE). The p-type cladding layer and p-type guide layer are doped with nitrogen (N) as a p-type impurity by exposure to a nitrogen plasma generated by an RF (radio frequency) plasma generator or an ECR (electron cyclotron resonance) plasma generator.

Doping with nitrogen as a p-type impurity as mentioned above suffers the disadvantage that the carrier concentration in the p-type cladding layer and p-type guide layer increases to a certain level in proportion to the amount of doped nitrogen, whereas the carrier concentration does not increase any longer and remains unchanged once it has reached a certain level even though the amount of doped nitrogen is increased and it rather decreases when the amount of doped nitrogen is increased further. The carrier concentration which has reached a certain level is called saturated carrier concentration.

Incidentally, the saturated concentration of activated nitrogen is empirically known to be about $1\times10^{18} cm^{-3}$ for ZnSe and about $2\times10^{17} cm^{-3}$ for znMgSSe mixed crystal. There is a relationship as shown in FIG. 3 between the concentration of doped nitrogen and the concentration of activated nitrogen ($N_A - N_D$). The result of doping nitrogen in excess of the saturated concentration of activated nitrogen is point defects of every kind due to inactive nitrogen. These defects lead to carrier compensation and inactivation which in turn leads to a decrease in the concentration of activated nitrogen.

Moreover, inactive nitrogen appears to deteriorate and adversely affect the active layer and lower the light intensity. This is a hindrance to long-lived semiconductor light emitting devices.

SUMMARY OF THE INVENTION

The present invention was completed in view of the above-mentioned problems. It is an object of the present invention to provide a semiconductor light emitting device which has a long life owing to an adequate concentration of p-type impurity doped therein.

DESCRIPTION OF THE PREFERRED EMBODIMENTS

The gist of the present invention resides in a semiconductor light emitting device characterized in that a first cladding layer, a first guide layer, an active layer, a second guide layer, and a second cladding layer are laminated sequentially on top of the other on a substrate, said first and second cladding layers being formed from a II–VI compound semiconductor composed of at least one species selected from the group consisting of zinc, mercury, cadmium, magnesium, and beryllium as Group II elements and at least one species selected from the group consisting of sulfur, selenium, and tellurium as Group VI elements, either of said first and second cladding layers being a p-type one doped with a p-type impurity such that the concentration of the p-type impurity in the part adjacent to the active layer is lower than the concentration at which the rate of activation begins to decrease.

This semiconductor light emitting device emits light due to electron-hole recombination in the active layer upon application of a prescribed voltage across the first and second cladding layers. The p-type cladding layer, in which the concentration of p-type impurity in the low-concentration region is lower than that at which the rare of activation begins to decrease, prevents inactive nitrogen from occurring excessively and hence is free from point defects due to inactive nitrogen.

EXAMPLES

The embodiments of the present invention will be described in more detail with reference to the accompanying drawings.

Figure 1:
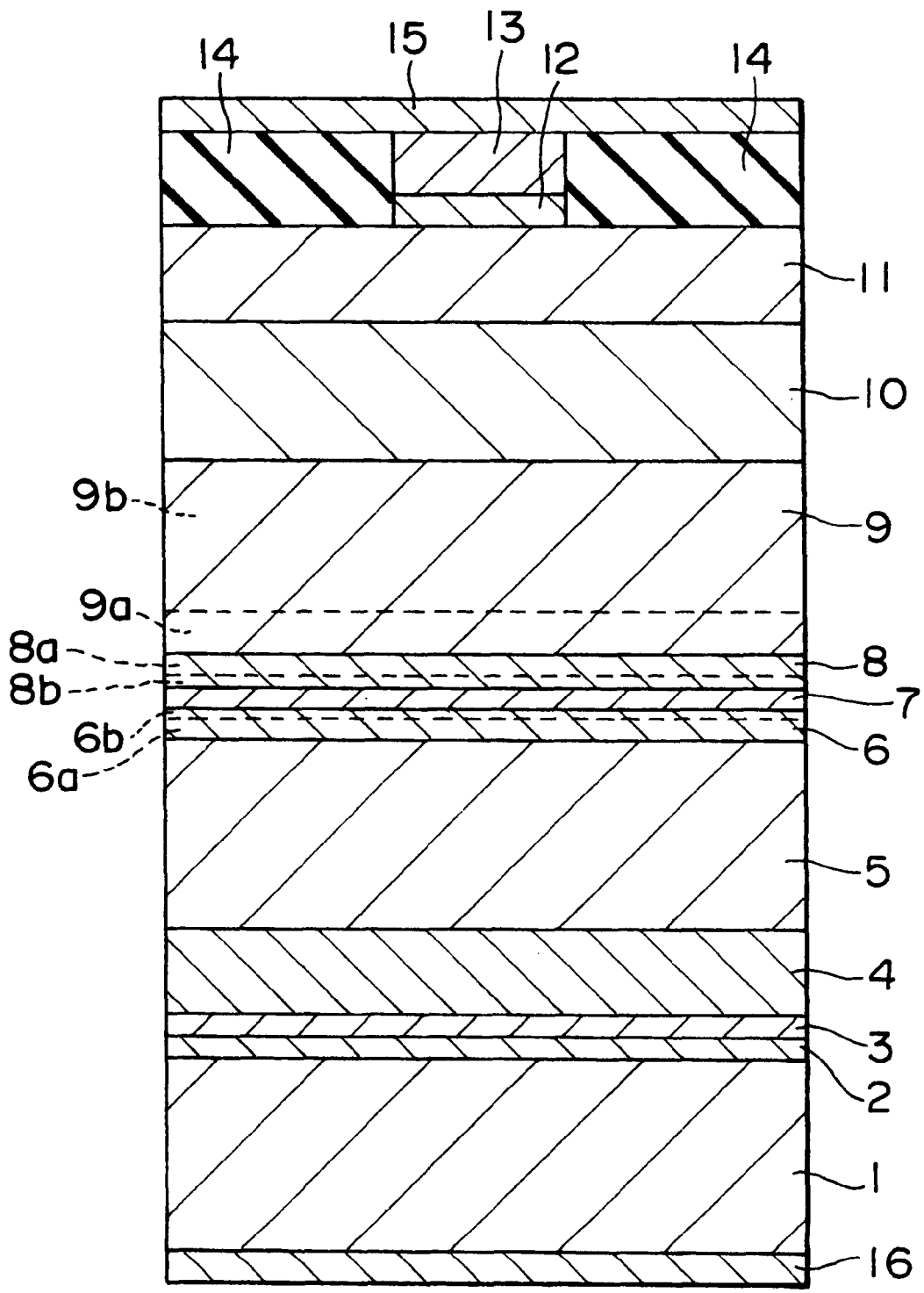
FIG. 1 is a sectional view showing the semiconductor light emitting diode pertaining to one embodiment of the present invention.

FIG. 1 schematically shows the structure of the semiconductor light emitting device pertaining to one embodiment of the present invention. This semiconductor light emitting device consists of a substrate 1 of p-type GaAs with the (100) plane and sequentially laminated layers thereon which include n-type buffer layers 2, 3, 4, an n-type cladding layer 5, an n-type guide layer 6, an active layer 7, a p-type guide layer 8, and a p-type cladding layer 9.

The n-type buffer layer 2 is, say, 500 nm thick and is formed from GaAs doped with Si as an n-type impurity. The buffer layer 3 is, say, 30 nm thick and is formed from ZnSe doped with chlorine (Cl) as an n-type impurity. The concentration of chlorine is, say, $7\times10^{17} cm^{-3}$. The buffer layer 4 is, say, 300 nm thick and is formed from ZnSSe mixed crystal doped with chlorine as an n-type impurity. The concentration of chlorine is, say, $7\times10^{17} cm^{-3}$.

The n-type cladding layer 5 is, say, 800 nm thick and is formed from ZnMgSSe mixed crystal doped with chlorine as an n-type impurity. The concentration of chlorine is, say, $1\times10^{17} cm^{-3}$ to $3\times10^{17} cm^{-3}$. This concentration is determined according to the concentration of p-type impurity in the p-type cladding layer 9 (mentioned later). In other words, the concentration of chlorine is balanced with that in the p-side from the standpoint of p-n junction, because the concentration of chlorine is linearly related with the light intensity over a longer range than the concentration of nitrogen is linearly related with the light intensity.

The n-type guide layer 6 is, say, 120 nm thick and is formed from ZnSSe mixed crystal. That part of the n-type guide layer 6 which is adjacent to the n-type cladding layer 5 constitutes the n-type semiconductor region 6a owing to doping with chlorine as an n-type impurity. The concentration of chlorine is, say, $1 \times 10^{17}$ cm$^{-3}$. This concentration is determined according to the concentration of p-type impurity in the p-type guide layer 8 (mentioned later), as in the case of the p-type cladding layer. The remainder of the n-type guide layer 6 (which is adjacent to the active layer 7) constitutes the intrinsic semiconductor region 6b which is not doped with n-type impurity and p-type impurity.

The active layer 7 is, say, 6 nm thick and is formed from ZnCdSe mixed crystal of single quantum-well structure or multi quantum-well structure.

The p-type guide layer 8 is, say, 120 nm thick and is formed from ZnSSe mixed crystal. That part of the p-type guide layer 8 which is adjacent to the p-type cladding layer 9 constitutes the p-type semiconductor region 8a doped with nitrogen (N) as an n-type impurity. The concentration of nitrogen is, say, $2 \times 10^{17}$ cm$^{-3}$. The remainder of the p-type guide layer 8 (which is adjacent to the active layer 7) constitutes the intrinsic semiconductor region 8b which is not doped with n-type impurity and p-type impurity.

Figure 2:
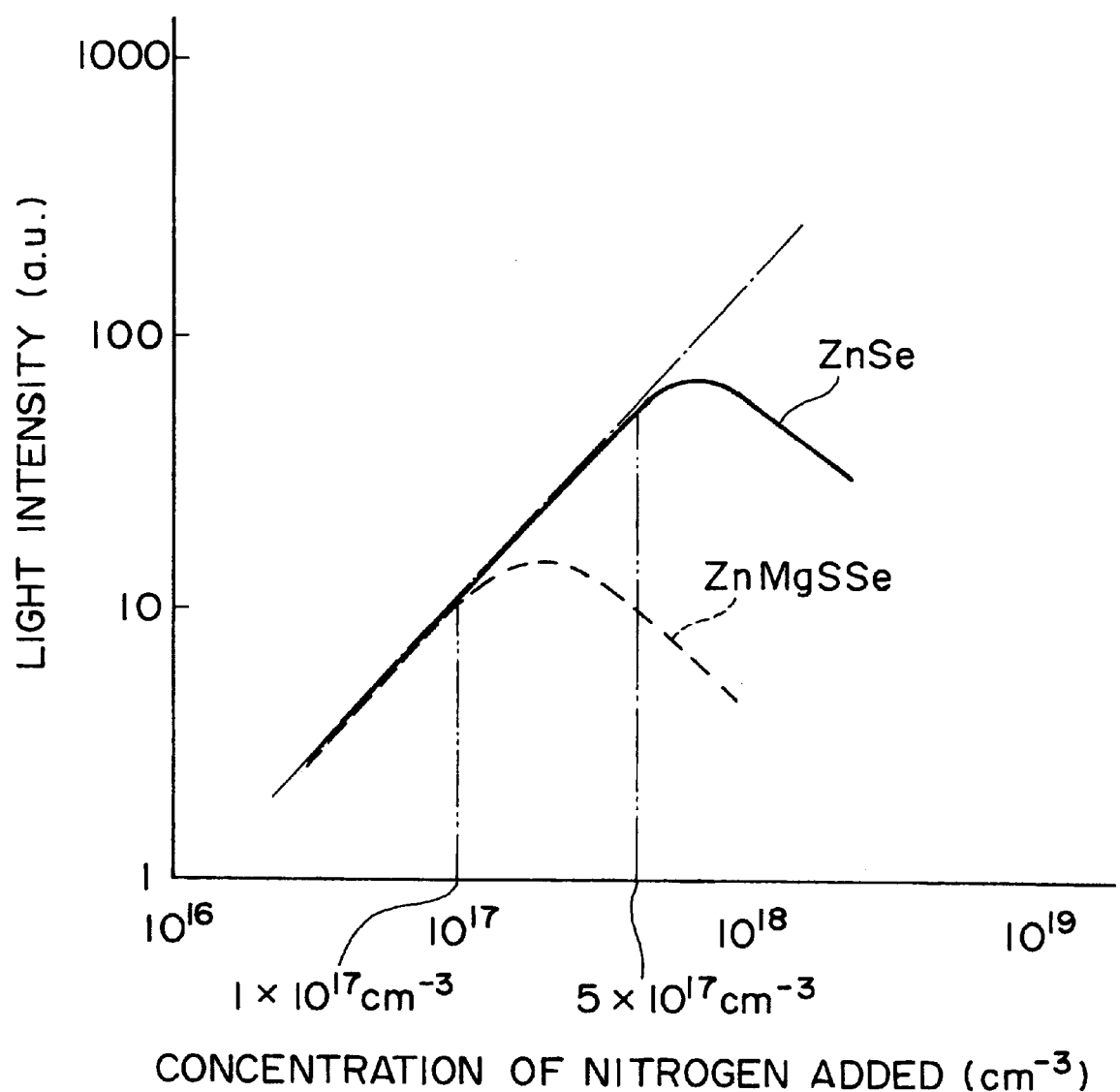
FIG. 2 is a graph showing the relationship between the concentration of nitrogen and light intensity in the case of the semiconductor light emitting device shown in FIG. 1.

Specifying the value of $2 \times 10^{17}$ cm$^{-3}$ for the concentration of nitrogen in the p-type semiconductor region 8a is necessary for the ZnSSe mixed crystal to exhibit its high light intensity and to exhibit its low resistance, with the upper and lower limits being $5 \times 10^{17}$ cm$^{-3}$ and $1 \times 10^{17}$ cm$^{-3}$, respectively. For reference, FIG. 2 shows the relationship between the concentration of nitrogen and the light intensity in the case of ZnSe. It is noted that the relationship in the case of ZnSe is similar to that in the case of ZnSSe mixed crystal so long as the concentration of nitrogen is lower than $5 \times 10^{17}$ cm$^{-3}$.

The p-type cladding layer 9 is, say, 1 $\mu$m thick and is formed from ZnMgSSe mixed crystal doped with nitrogen as a p-type impurity. That part (100–200 nm) of the p-type cladding layer 9 which is adjacent to the p-type guide layer 8 constitutes the low concentration region 9a in which the concentration of nitrogen is low. The remainder (900–800 nm thick) of the p-type cladding layer 9 is the high concentration region 9b in which the concentration of nitrogen is high. The concentration of nitrogen in the low concentration region 9a is, say, $1 \times 10^{17}$ cm$^{-3}$, and the concentration of nitrogen in the high concentration region 9b is, say, $2 \times 10^{17}$ cm$^{-3}$.

Specifying the value of $2 \times 10^{17}$ cm$^{-3}$ for the concentration of nitrogen in the high concentration region 9b is necessary to avoid the situation in which the light intensity decrease due to point defects resulting from inactive nitrogen in excess of the saturated concentration of activated nitrogen.

Figure 3:
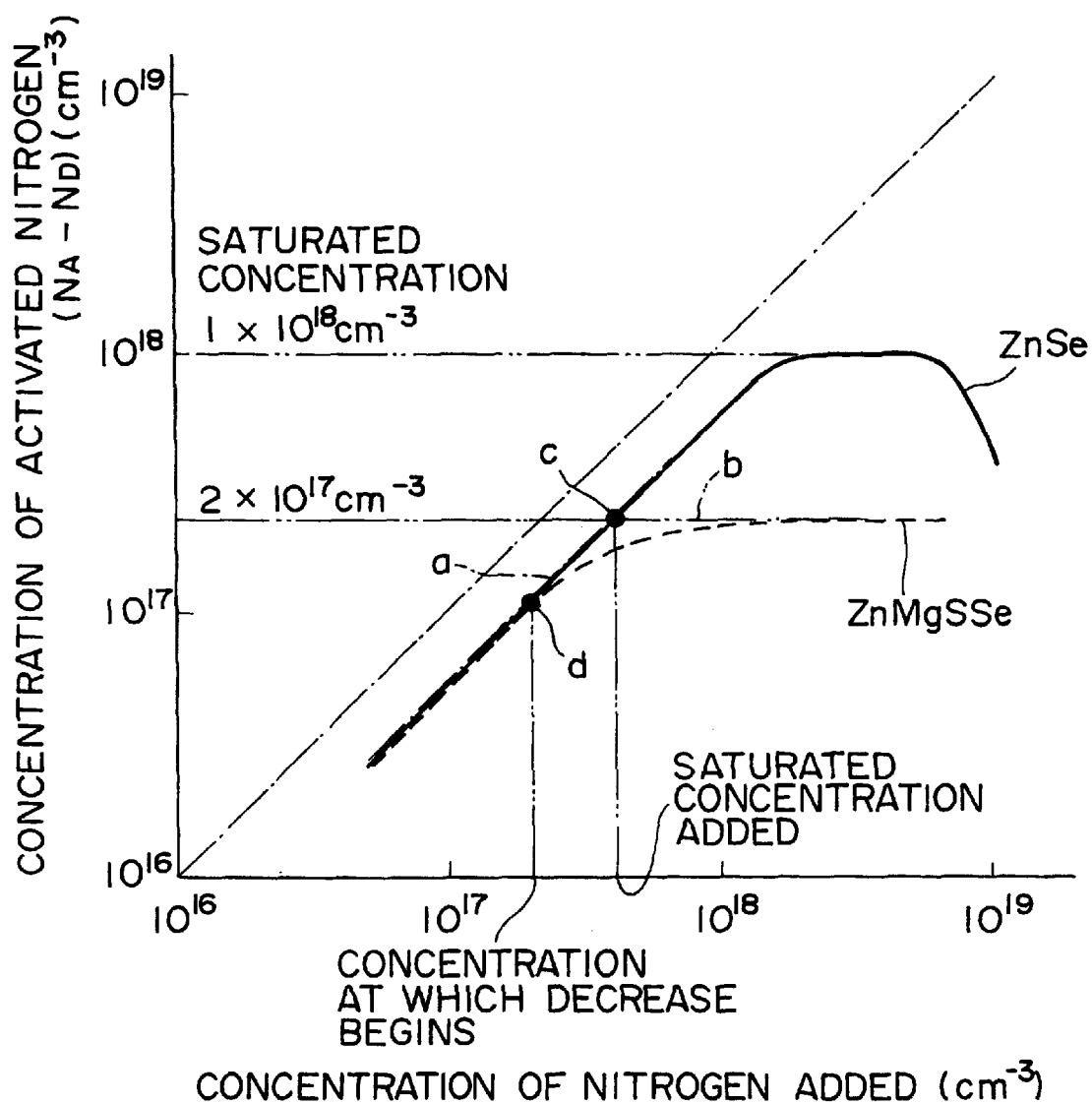
FIG. 3 is a graph showing the relationship between the concentration of nitrogen and the rate of activation of nitrogen in the case of the semiconductor device shown in FIG. 1.

The saturated concentration of activated nitrogen implies the concentration of nitrogen indicated by the point c in FIG. 3, in which the rate of nitrogen activation is plotted against the concentration of nitrogen in ZnMgSSe mixed crystal (which the band energy gap at room temperature ($Eg_{RT}$) being 2.95 eV). The point c is the point of intersection of the line a and the line b. The line a is the prolonged line of that part of the curve at which the concentration of active nitrogen is increasing at a constant rate. The line b is the prolonged line of that part of the curve at which the concentration of active nitrogen has leveled off. Incidentally, the saturated concentration shown in FIG. 3 is about $5 \times 10^{17}$ cm$^{-3}$. The saturated concentration decreases according as the band gap energy $Eg_{RT}$ of ZnMgSSe mixed crystal increases.

Specifying the value of $1 \times 10^{17}$ cm$^{-3}$ for the concentration of nitrogen in the low concentration region 9a is necessary to prevent defects while keeping resistance low. (Defects in the part close to the active layer 7 have a greater influence on the deterioration of the active layer 7.)

In other words, if the concentration of nitrogen is higher than the concentration at which the rate of activation begins to decrease, the rate of activation of nitrogen decreases, resulting in an increase in point defects. The concentration at which the rate of activation begins to decrease is defined by the point d in FIG. 3. The point d is the point at which the rate of activation begins t deviate from the straight line a. Incidentally, the saturated concentration in FIG. 3 is about $2 \times 10^{17}$ cm$^{-3}$. Incidentally, the saturated concentration decreases according as the band gap energy $Eg_{RT}$ of ZnMgSSe mixed crystal increases.

Incidentally, the concentration of nitrogen should be lower than $2 \times 10^{17}$ cm$^{-3}$ (which is the concentration at which the rate of activation begins to decrease),preferably lower than $1 \times 10^{17}$ cm$^{-3}$, As shown in FIG. 2 (nitrogen concentration vs. light intensity in ZnMgSSe mixed crystal), the rate of increase in light intensity decreases when the concentration of nitrogen exceeds $1 \times 10^{17}$ cm$^{-3}$.

Moreover, the concentration of nitrogen lower than $1 \times 10^{16}$ cm$^{-3}$ may lead to a higher resistance.

On the p-type cladding layer 9 are laminated sequentially a first semiconductor layer 10, a second semiconductor layer 11, a superlattice semiconductor layer 12, and a contact layer 13, through which a good ohmic contact with the p-side electrode is established.

The first semiconductor layer 10 is, say, 400 nm thick and is formed from ZnSSe mixed crystal doped with nitrogen as a p-type impurity. The amount of nitrogen is, say, $5 \times 10^{17}$ cm$^{-3}$. The second semiconductor layer 11 is, say, 200 nm thick and is formed from ZnSe doped with nitrogen as p-type impurity. The amount of nitrogen is, say, $8 \times 10^{17}$ cm$^{-3}$. The superlattice semiconductor layer 12 is a laminate alternately formed from ZnSe and ZnTe doped with nitrogen as a p-type impurity. The contact layer is, say, 70 nm thick and is formed from ZnTe doped with nitrogen as a p-type impurity.

The superlattice semiconductor layer 12 and the contact layer 13 are in the form of strip which is, say, 10 $\mu$m wide. An insulating layer 14 of, say, alumina (Al$_2$O$_3$) is formed on that area of the second semiconductor layer 11 where the superlattice semiconductor layer 12 and the contact layer 13 are not formed.

On the insulating layer 14 and the contact layer 13 is a laminated p-side electrode 15 which is formed from palladium(Pd), platinum (Pt), and gold (Au) arrange upward on top of the other. On the back side of the substrate 1 is an n-side electrode 16 formed from indium(In).

The semiconductor light emitting device constructed as mentioned above can be formed in the following manner.

First, the substrate 1 is prepared from n-type GaAs having the (100) plane. On this substrate 1 are formed sequentially by MBE the buffer layers 2, 3, 4, the n-type cladding layer 5, the n-type guide layer 6, the active layer 7, the p-type guide layer 8, the p-type cladding layer 9, the first semiconductor layer 10, the second semiconductor layer 11, the superlattice semiconductor 12, and the contact layer 13.

The MBE technique is designed such that the molecular beams of the constituents from sources corresponding to respective compound semiconductors impinge upon the substrate. The doping of the buffer layers 2, 3, 4, the n-type cladding layer 5, and the n-type guide layer 6 with chlorine as an n-type impurity is accomplished by irradiation with the molecular beams of chlorine and each constituent from the sources. The doping of the p-type guide layer 8, the p-type cladding layer 9, the first semiconductor layer 10, the second semiconductor layer 11, the superlattice semiconductor layer 12, and the contact layer 13 with nitrogen as a p-type impurity is accomplished by irradiation with the molecular beams of respective constituents in combination with nitrogen in the form of plasma generated by an RF plasma generator or an ECR plasma generator. The concentration of chlorine added is controlled by varying the heating temperature of the source cell, and the concentration of nitrogen added is controlled by varying the output of plasma.

Then, the contact layer 13 is coated with a resist, which is used afterward to form a strip mask pattern (not shown) by photolithography. Using this mask pattern, wet etching or dry etching is performed to selectively remove the contact layer 13 and the superlattice layer 12, with a strip remaining. The second semiconductor layer 11, from which the contact layer 13 and the superlattice layer 12 have been removed, is coated with alumina by deposition. Finally, the mask pattern is removed (lift off) together with the alumina layer formed thereon. In this way the insulating layer 14 is formed.

The insulating layer 14 and the contact layer 13 are coated with palladium, platinum, and gold sequentially by vapor deposition to form a p-side electrode 15. The back side of the substrate 1 is coated with indium by vapor deposition to form an n-side electrode 16. In this way there is obtained the semiconductor light emitting device constructed as shown in FIG. 1.

This semiconductor light emitting device functions in the following manner. Application of a prescribed voltage across the p-side electrode 15 and the n-side electrode 16 causes current to flow from the p-side electrode 15 to the contact layer 13. The current then passes through the superlattice semiconductor layer 12, the second semiconductor layer 11, the first semiconductor layer 10, the p-type cladding layer 9, and the p-type guide layer 8 to enter the active layer 7, in which electron-hole recombination takes place to emit light.

This process does not cause inactive nitrogen to occur excessively in the p-type cladding layer 9 and the p-type guide layer 8. Hence there are no point defects due to inactive nitrogen. This in turn protects the active layer 7 from deterioration so that the light intensity remains unchanged.

According to the above-mentioned embodiment, the semiconductor light emitting device is characterized by that the concentration of nitrogen in the p-type semiconductor region 8a of the p-type guide layer 8 is $2 \times 10^{17}$ cm$^{-3}$, the concentration of nitrogen in the low-concentration region 9a of the p-type cladding layer is $1 \times 10^{17}$ cm$^{-3}$, and the concentration of nitrogen in the high-concentration region 9b of the p-type cladding layer 9 is $2 \times 10^{17}$ cm$^{-3}$. This arrangement prevents inactive nitrogen from occurring excessively and hence prevents point defects due to inactive nitrogen. The result is the protection of the active layer 7 from deterioration, the prevention of the lowering of light intensity, and the prolonged life of the device.

Although the invention has been described in its preferred form, many different embodiments may be made without departure from the spirit and scope thereof. For example, the concentration of nitrogen in the low-concentration region 9a of the p-type cladding layer 9 is not limited to $1 \times 10^{17}$ cm$^{-3}$ as mentioned above; it may take any value so long as it is lower than the concentration at which the rate of activation begins to decrease, as explained above. Preferably it may take any value in the range of $1 \times 10^{16}$ cm$^{-3}$ to $1 \times 10^{17}$ cm$^{-3}$.

The above-mentioned embodiment is characterized by that the concentration of nitrogen in the high-concentration region 9b of the p-type cladding layer 9 is $2 \times 10^{17}$ cm$^{-3}$. However, so long as this value is lower than the saturated concentration at which activated nitrogen begins to saturate, the same result as mentioned above will be produced.

Moreover, the above-mentioned embodiment is characterized by that the concentration of nitrogen in the p-type semiconductor region 8a of the p-type guide layer 8 is $2 \times 10^{17}$ cm$^{-3}$. However, this value may be changed in the range of $1 \times 10^{17}$ cm$^{-3}$ to $5 \times 10^{17}$ cm$^{-3}$.

The above-mentioned embodiment is characterized by that the n-type guide layer 6 and the p-type guide layer 8 are formed from ZnSSe mixed crystal. In modified embodiment, they may bi formed from ZnSe. In this case the concentration of nitrogen in the p-type semiconductor region of the p-type guide layer should be in the range of $1 \times 10^{17}$ cm$^{-3}$ to $5 \times 10^{17}$ cm$^{-3}$. (See FIG. 2.)

In addition, the above-mentioned embodiment is characterized by that the n-type cladding layer 5 and the p-type cladding layer 9 are formed from ZnMgSSe mixed crystal. In a modified embodiment they may be formed from a II–VI compound semiconductor, with the Group II element being at least one species selected from the group consisting of zinc, mercury, cadmium, magnesium, and beryllium,and the Group VI element being at least one species selected from the group consisting of sulfur, selenium, and tellurium, and tellurium. In this case, the concentration of nitrogen in the low-concentration region of the p-type cladding layer should be the same as that in the above-mentioned embodiment, so that the modified embodiment produces the same effect as the above-mentioned embodiment. The concentration in the high-concentration region should also be lower than the saturated concentration as in the case of the above-mentioned embodiment.

Moreover, the above-mentioned embodiment is characterized by that that part of p-type guide layer 8 which is adjacent to the p-type cladding layer 9 is the p-type semiconductor region 8a. In a modified embodiment, however, the p-type guide layer 8 may not be doped with nitrogen but is left as an intrinsic semiconductor region.

In addition, the above-mentioned embodiment is characterized by that the light emitting device is formed by laminating sequentially the n-type buffer layers 2, 3, 4, the n-type cladding layer 5, the n-type guide layer 6, the active layer 7, the p-type guide layer 8, the p-type cladding layer 9, the first p-type semiconductor layer 10, the second p-type semiconductor layer 11, the p-type superlattice semiconductor layer 12, the p-type contact layer 13 on the n-type substrate. In a modified embodiment, however, the light emitting device may be formed by laminating sequentially these p-type semiconductor layers, active layer, n-type semiconductor layers on a p-type substrate.

Moreover, the above-mentioned embodiment may be modified by using a substrate of InP, GaP, or ZnSe in place of that of GaAs.

As mentioned above, the semiconductor light emitting device of the present invention is characterized by that the first and second cladding layers re formed from a II–VI compound semiconductor, with the Group II element being at least one species selected from the group consisting of zinc, mercury, cadmium, magnesium, and beryllium, and the Group VI element being at least one species selected from the group consisting of sulfur, selenium, and tellurium, either of said first and second cladding layers being a p-type one doped with a p-type impurity such that the concentration of the p-type impurity in the part adjacent to the active layer is lower than the concentration at which the rate of activation begins to decrease. This prevents inactive occurring excessively in the p-type cladding layer and hence prevents the occurrence of point defects due to inactive nitrogen. These effects protect the active layer from deterioration and the light intensity from decreasing and hence prolong the life of the device.

What is claimed is:

1. A semiconductor light emitting device characterized in that a first cladding layer, a first guide layer, an active layer, a second guide layer, and a second cladding layer are laminated consecutively on top of the other on a substrate, said first and second cladding layers being formed from a II–VI compound semiconductor composed of at least one species selected from the group consisting of zinc, mercury, cadmium, magnesium, and beryllium as Group II elements and at least one species selected from the group consisting of sulfur, selenium, and tellurium as Group VI elements, one of said first and second cladding layers being a p-type cladding layer doped with a p-type impurity such that a first concentration of the p-type impurity in a portion of the p-type cladding layer closest to the active layer is less than a second concentration of the p-type impurity in a remainder of the p-type cladding layer not closest to the active layer, the first concentration being less than or equal to a third concentration of the p-type impurity at which the rate of activation begins to decrease, the second concentration of the p-type impurity being less than or equal to a fourth concentration of the p-type impurity at which activated p-type impurity begins to saturate.

2. A semiconductor light emitting device as defined in claim 1, wherein the third concentration of p-type impurity is less than or equal to the fourth concentration of p-type impurity.

3. A semiconductor light emitting device as defined in claim 1, wherein the p-type impurity is nitrogen.

4. A semiconductor light emitting device as defined in claim 3, wherein the first and second cladding layers are formed from ZnMgSSe mixed crystal and the first concentration of p-type impurity nitrogen is in the range of $1\times10^{16}$ cm$^{-3}$ to $1\times10^{17}$ cm$^{-3}$.

5. A semiconductor light emitting device as defined in claim 1, wherein the first and second guide layers are formed from ZnSe or ZnSSe mixed crystal, the one guide layer of said first and second guide layers which is formed between the p-type cladding layer and the active layer is a p-type layer and part of the p-type guide layer which is adjacent the p-type cladding layer is a p-type semiconductor region doped with nitrogen as a p-type impurity, the remainder of the p-type guide layer other than the p-type semiconductor region is an intrinsic semiconductor region, and the concentration of nitrogen in the p-type semiconductor region is in the range of $1\times10^{17}$ cm$^{-3}$ to $5\times10^{17}$ cm$^{-3}$.

6. A semiconductor light emitting device as defined in claim 1, wherein the first and second cladding layers are formed from ZnMgSSe and the first and second guide layers are formed form ZnSSe.

* * * * *